(12) United States Patent
McLaury

(10) Patent No.: US 9,286,952 B2
(45) Date of Patent: Mar. 15, 2016

(54) SRAM WITH TWO-LEVEL VOLTAGE REGULATOR

(71) Applicant: Lattice Semiconductor Corporation, Hillsboro, OR (US)

(72) Inventor: Loren McLaury, Hillsboro, OR (US)

(73) Assignee: LATTICE SEMICONDUCTOR CORPORATION, Portland, OR (US)

( * ) Notice: Subject to any disclaimer, the term of this patent is extended or adjusted under 35 U.S.C. 154(b) by 0 days.

(21) Appl. No.: 14/320,074

(22) Filed: Jun. 30, 2014

(65) Prior Publication Data

US 2015/0380064 A1 Dec. 31, 2015

(51) Int. Cl.

| | |
|---|---|
| *G11C 11/419* | (2006.01) |
| *G11C 11/417* | (2006.01) |
| *G11C 5/14* | (2006.01) |
| *G11C 11/416* | (2006.01) |
| G11C 5/02 | (2006.01) |
| G11C 7/08 | (2006.01) |
| G11C 11/4074 | (2006.01) |
| G11C 11/412 | (2006.01) |

(52) U.S. Cl.
CPC .............. *G11C 5/147* (2013.01); *G11C 11/419* (2013.01); *G11C 5/025* (2013.01); *G11C 5/148* (2013.01); *G11C 7/08* (2013.01); *G11C 11/4074* (2013.01); *G11C 11/412* (2013.01); *G11C 11/417* (2013.01)

(58) Field of Classification Search
CPC .. G11C 11/419; G11C 11/412; G11C 11/417; G11C 5/025; G11C 5/147; G11C 11/4074; G11C 5/148; G11C 7/08

USPC ................ 365/154, 155, 156, 189.09, 189.11
See application file for complete search history.

(56) References Cited

U.S. PATENT DOCUMENTS

| | | | |
|---|---|---|---|
| 5,808,942 A | 9/1998 | Sharpe-Geisler | |
| 6,418,045 B2 | 7/2002 | Camarota | |
| 8,811,068 B1 * | 8/2014 | Clark et al. | 365/154 |
| 2008/0043561 A1 * | 2/2008 | Wang et al. | 365/227 |
| 2013/0083591 A1 * | 4/2013 | Wuu et al. | 365/154 |
| 2013/0141962 A1 * | 6/2013 | Liaw | 365/154 |
| 2013/0141963 A1 * | 6/2013 | Liaw | 365/156 |
| 2013/0235652 A1 * | 9/2013 | Liaw | 365/156 |
| 2014/0112060 A1 * | 4/2014 | Adams et al. | 365/154 |
| 2014/0169077 A1 * | 6/2014 | Kolar et al. | 365/156 |

* cited by examiner

*Primary Examiner* — Ly D Pham

(57) ABSTRACT

A programmable logic device (PLD) is provided with a two-level voltage regulator for powering SRAM cells within the device. In one example, a PLD includes a plurality of static random access memory (SRAM) cells configured to store a configuration for the programmable logic device. The PLD also includes a two-level voltage regulator configured to selectively charge a first power supply node to a reduced voltage and to an enhanced voltage that is greater than the reduced voltage. The SRAM cells are powered through a coupling to the first power supply node. The PLD also includes a control circuit configured to control the two-level voltage regulator to charge the first power supply node to the reduced voltage during a write operation for the SRAM cells and to charge the first power supply node to the enhanced voltage during normal operation of the configured programmable logic device.

18 Claims, 6 Drawing Sheets

SRAM WITH TWO-LEVEL VOLTAGE REGULATOR

TECHNICAL FIELD

The present invention relates generally to memories, and more particularly, to an SRAM with a two-level voltage regulator.

BACKGROUND

Programmable logic devices such as field programmable gate arrays (FPGAs) include a plurality of logic blocks. Each logic block includes one or more lookup tables the contents of which are programmable through corresponding static random access memory (SRAM) cells. For example, sixteen SRAM cells may store the contents of a four input lookup table. The configuration of an FPGA thus involves writing to numerous SRAM cells.

Configured SRAM cells in an FPGA not only control the contents of the lookup tables but also configure other components such as programmable routing multiplexers in the routing for the FPGA. The SRAM cells are typically supplied by a power supply voltage that is higher than a core logic supply of VCC for core logic. In one embodiment, the power supply voltage may equal 1.36 V whereas VCC equals 1.1 V. In this fashion, the programmable routing multiplexers may be constructed from n-channel pass gates but still pass sufficiently high binary ones due to the elevated power supply voltage driving the gates on the n-channel devices.

Although the elevated power supply voltage for the SRAM cells is advantageous for programming elements such as the routing multiplexers, the SRAM cells may then suffer from wear-out mechanisms such as hot-carrier-injection (HCI) when they are programmed (written to) at the elevated level of 1.36 V. Accordingly, there is a need in the art for more robust SRAM power regulation schemes.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

An SRAM is provided that includes three different power domains. A VCCM power supply domain includes the cross-coupled inverters in the SRAM cells. A two-level voltage regulator powers the VCCM power supply domain with a VCCM power supply voltage. During normal operation (after configuration) of the SRAM cells, the two-level voltage regulator drives the power supply voltage VCCM to an elevated level. During configuration (writing) of the SRAM cells, the two-level voltage regulator drives the power supply voltage VCCM to a reduced level that is lower than the elevated level. A VCC power supply domain includes the write buffers for driving the bit lines. An external VCC voltage regulator (not shown) powers the VCC power supply domain with a VCC power supply voltage that is lower than the reduced level for the VCCM power supply voltage. A hybrid power supply domain includes the word line drivers for driving the gates of the access transistors for the SRAM cells. The two-level power regulator powers the word line drivers during write operations to the SRAM cells. During read operations, the VCC voltage regulator powers the word line drivers. The two levels for the VCCM power supply voltage is quite advantageous in that both the access transistors and the SRAM cell cross-coupled inverters are protected from write operation damage such as hot channel injection during SRAM cell configuration.

Figure 1:
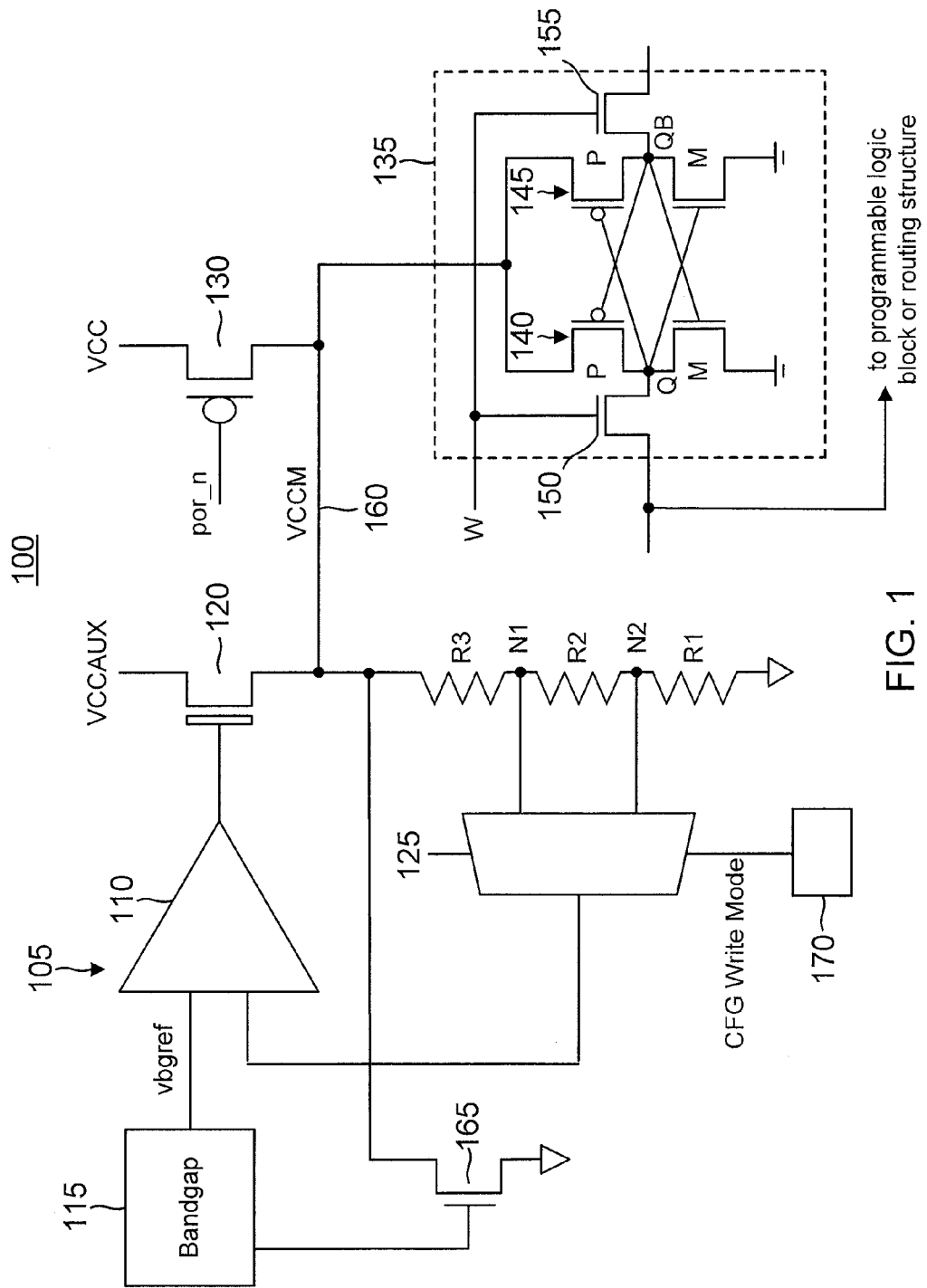
FIG. 1 is a circuit diagram of a programmable logic device including a two-level voltage regulator for powering an SRAM cell.

These advantageous features may be better appreciated with regard to the example programmable logic device 100 shown in FIG. 1. Device 100 includes a plurality of SRAM cells for configuration of the truth tables for logic blocks (not illustrated) and routing structures such as routing multiplexers (not illustrated). For illustration clarity, only a single SRAM cell 135 is shown in device 100 but it will be appreciated that device 100 will typically include numerous other SRAM cells. SRAM cell 135 includes a pair of cross-coupled inverters 140 and 145. Each cross-coupled inverter includes a PMOS transistor P having a source coupled to a power supply voltage rail 160 that carries the power supply voltage VCCM. Each cross-coupled inverter also includes a NMOS transistor M having a source coupled to ground and a drain coupled to the drain of the corresponding PMOS transistor P. The drains in cross-coupled inverter 140 couple to a drain/source terminal of an access transistor 150. A remaining drain/source terminal for access transistor 150 couple to a bit line B (not illustrated). A word line W drives the gate of access transistor 150 so that a Q signal stored in SRAM cell 135 can drive the bit line. Similarly, the drains in cross-coupled inverter 145 couple to a drain/source terminal of an access transistor 155 that has a remaining drain/source terminal couple to a complement bit line /B (not illustrated). The word line W also drives the gate of access transistor 155 so that a complement Q signal (QB) stored in SRAM cell 135 can drive the complement bit line. Depending upon its intended use with regard to the programmable logic device configuration, the Q signal may program, for example, a truth table in a programmable logic block or a routing multiplexer in the routing structure.

A two-level power regulator 105 regulates the power supply voltage VCCM using a differential amplifier 110 that drives a gate of a transistor 120 accordingly. In this embodiment, transistor 120 is an NMOS transistor but it may comprise a PMOS transistor in alternative embodiments. The drain of transistor 120 couples to a power supply node carrying a power supply voltage VCCAUX. The source of transistor 120 couples to voltage rail 160. To control the extent to which differential amplifier 110 switches on transistor 120 so as to charge voltage rail 160 and affect the power supply voltage VCCM accordingly, a control signal (CFG write mode) controls a multiplexer 125 within two-level power regulator 105 to control whether the power supply voltage VCCM is either in the elevated or reduced level. A serial combination of a resistor R1, R2, and R3 couple between ground and a source of transistor 120. Depending upon a binary state for the CFG write mode control signal as determined by a control circuit 170, multiplexer 125 selects for a node N1 between resistors R2 and R3 or a node N2 between resistors R2 and R1 to drive an output coupled to one of the inputs for differential amplifier 110. A reference circuit such as a bandgap reference circuit 115 drives a remaining input for differential amplifier 110 with a reference voltage such as a bandgap voltage (vbgref). A feedback loop is thus formed through differential amplifier 110 with regard to the voltage on the selected node by multiplexer 125. In that regard, the resistors R1, R2, and R3 form a voltage divider that is driven by the power supply voltage VCCM. The symbols R1, R2, and R3 also identify the resistance of the corresponding resistor. Given this convention, the voltage at node N1 equals VCCM*(R1+R2)/(R1+R2+R3). Similarly, the voltage at node N2 equals VCCM*(R1/(R1+R2+R3)). The negative feedback loop through differential amplifier 110 functions to keep its input voltages the same such that differential amplifier 110 will drive the gate of transistor 120 so that transistor 120 conducts to charge VCCM so that the selected node voltage equals the reference voltage vbgref. Thus, if multiplexer 125 selects for node N1, the power supply voltage VCCM equals vbgref*(R1+R2+R3)/(R1+R2). This is the reduced level for the power supply voltage VCCM. But if multiplexer 125 selects for node N2, the power supply voltage VCCM equals vbgref*(R1+R2+R3)/R1, which is the elevated level for VCCM.

A shunt transistor 165 couples between voltage rail 160 and ground. In this fashion, there is a weak discharge of voltage rail 160 to provide a controlled way to discharge the power supply voltage VCCM from the increased level to the reduced level. In one embodiment, bandgap reference circuit 165 may control the channel size in shunt transistor 165 to control the weak discharge rate for voltage rail 160.

Figure 2:
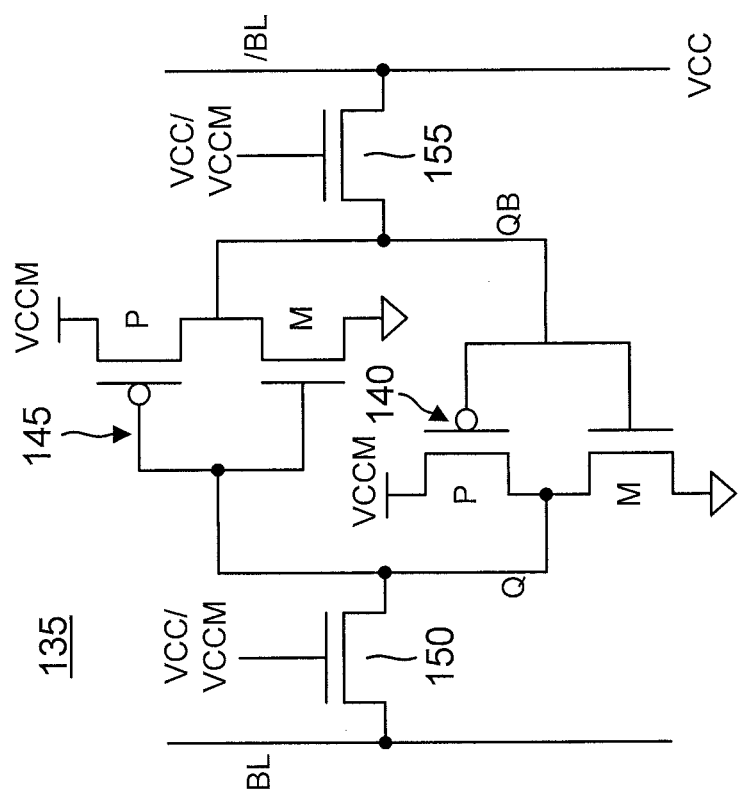
FIG. 2 illustrates the SRAM cell of FIG. 1 including the corresponding bit lines.

SRAM cell 135 is illustrated in more detail in FIG. 2. A bit line BL couples through access transistor 150 to an output of cross-coupled inverter 140. Similarly, a complement bit line /BL couples through access transistor 155 to an output of cross-coupled inverter 145. The word line (not illustrated) driving the gates of access transistors 150 and 155 alternates between the VCC and VCCM power domain. The bit lines are powered by write buffers (not illustrated) within the VCC power domain. Finally, cross-coupled inverters 140 and 145 have the sources of their PMOS transistors P tied to VCCM so that cell power supply is part of the VCCM power domain. In one embodiment, the voltages for the cell power supply, the wordline, and the bit lines may be as follows:

| Mode | Cell Supply | Wordline | Bitline |
|---|---|---|---|
| Normal cell Read | 1.36 V (VCCM) | 1.1 V (VCC) | 1.1 V (VCC) |
| Normal cell Write | 1.21 V (VCCM) | 1.21 V (VCCM) | 1.1 V (VCC) |

In such an embodiment, the elevated level for the power supply voltage VCCM is 1.36 V, which is used during normal cell read operations. The reduced level for VCCM during a write operation may be 1.21 V. Referring back to two-level power regulator 105 of FIG. 1, the resistances R1, R2, and R3 are readily determined so that the desired levels for VCCM may be achieved using the equations discussed above. In contrast to VCCM, the power supply voltage VCC may be unchanged at 1.1 V. The word line voltage alternates between the reduced value for VCCM for write operations and VCC for read operations.

If the power supply voltage VCCM and the word line voltage is too high during a write operation, access transistors 150 and 155 as well as the NMOS transistors M in SRAM cell 135 may be damaged. The resulting loss in conductivity leads to errors during read operations. For example, suppose that SRAM cell 135 of FIG. 2 is storing a logic zero. In the absence of damage, the true bit line will then discharge to ground during the read operation through access transistor 150 and the NMOS transistor M in cross-coupled inverter 135. But if the conductivities of these transistors is too low from overvoltage damage, the precharged voltage on the true bit line will not discharge sufficiently, which can lead to an erroneous read operations. The two-level voltage regulation disclosed herein advantageously eliminates this issue. Alternatively, if the VCCM level is too high during the SRAM write operation, the damage caused in access transistors 150 and 155 in SRAM cell 135 will eventually lead to the degradation in the write-ability of the SRAM cells, and thus the write operation will fail. Again, the two-level voltage regulation disclosed herein advantageously eliminates this over stress issue.

Figure 3:
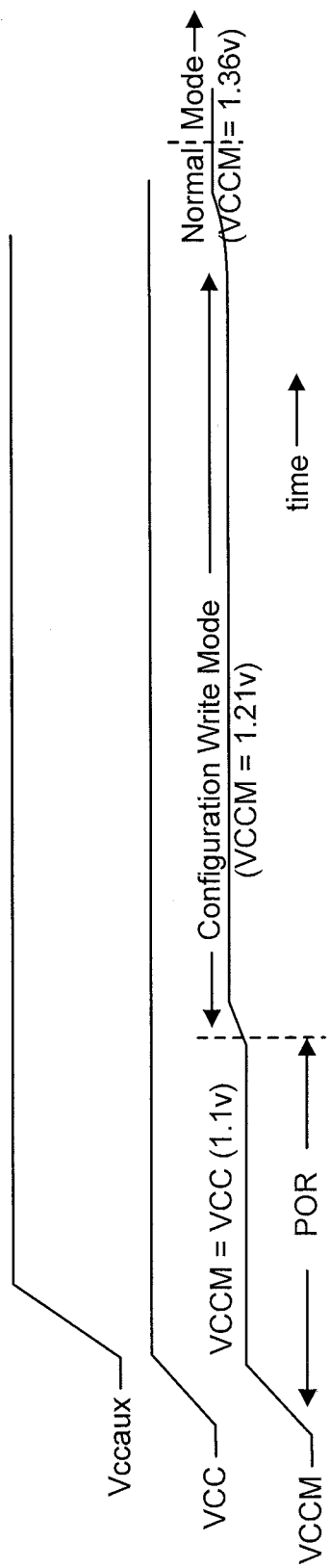
FIG. 3 is a timing diagram of a power-on and programming sequence for power supply voltages in the programmable logic device of FIG. 1.

FIG. 3 illustrates a power-on and programming sequence for SRAM cell 135 as powered by two-level power regulator 105. The power supply voltage VCCAUX for powering the drain of transistor 120 goes high at the start of the power-on-reset (POR) period to a value that is at least a threshold voltage higher than the elevated level for VCCM. Because of this relatively high amplitude for the power supply voltage VCCAUX, transistor 120 may comprise a thick-oxide transistor to protect against overvoltage damage. The transistors for the remaining devices shown for programmable logic device 100 of FIG. 1 may all comprise relatively-thin-oxide transistors. At the beginning of the POR period, a por_n control signal is asserted low so that a PMOS transistor 130 as shown in FIG. 1 couples VCCM rail 160 to the power supply voltage VCC. The cell supply is thus initially in the VCC power domain during the POR period. Upon completion of the POR period, SRAM cell 135 may be configured (written to) during a write mode period. As shown in FIG. 3, VCCM increases to its reduced level during the write mode period. This is illustrated as 1.21 V but it will be appreciated that the actual value depends upon the particular process node being used to construct the programmable logic device. After SRAM cell 135 has been configured, a normal mode of operation for the programmable logic device may commence in which the programmable logic device implements whatever logical behavior was desired as determined by the SRAM programming. The power supply voltage VCCM is raised to its elevated level such as 1.36 V during this normal mode of operation, which would include read operations. As used herein, a read operation may be one which occurs through a sense amplifier. But note that the SRAM cells in a programmable logic device also control elements such as the truth tables in the programmable logic blocks and the routing multiplexers directly rather than through a sense amplifier. The elevated level for VCCM as disclosed herein enables the SRAM cells to have a sufficient overdrive voltage for controlling the routing multiplexers. The reduced level for VCCM prevents high-voltage damage to the SRAM cells and the access transistors during write operations.

Figure 4A:
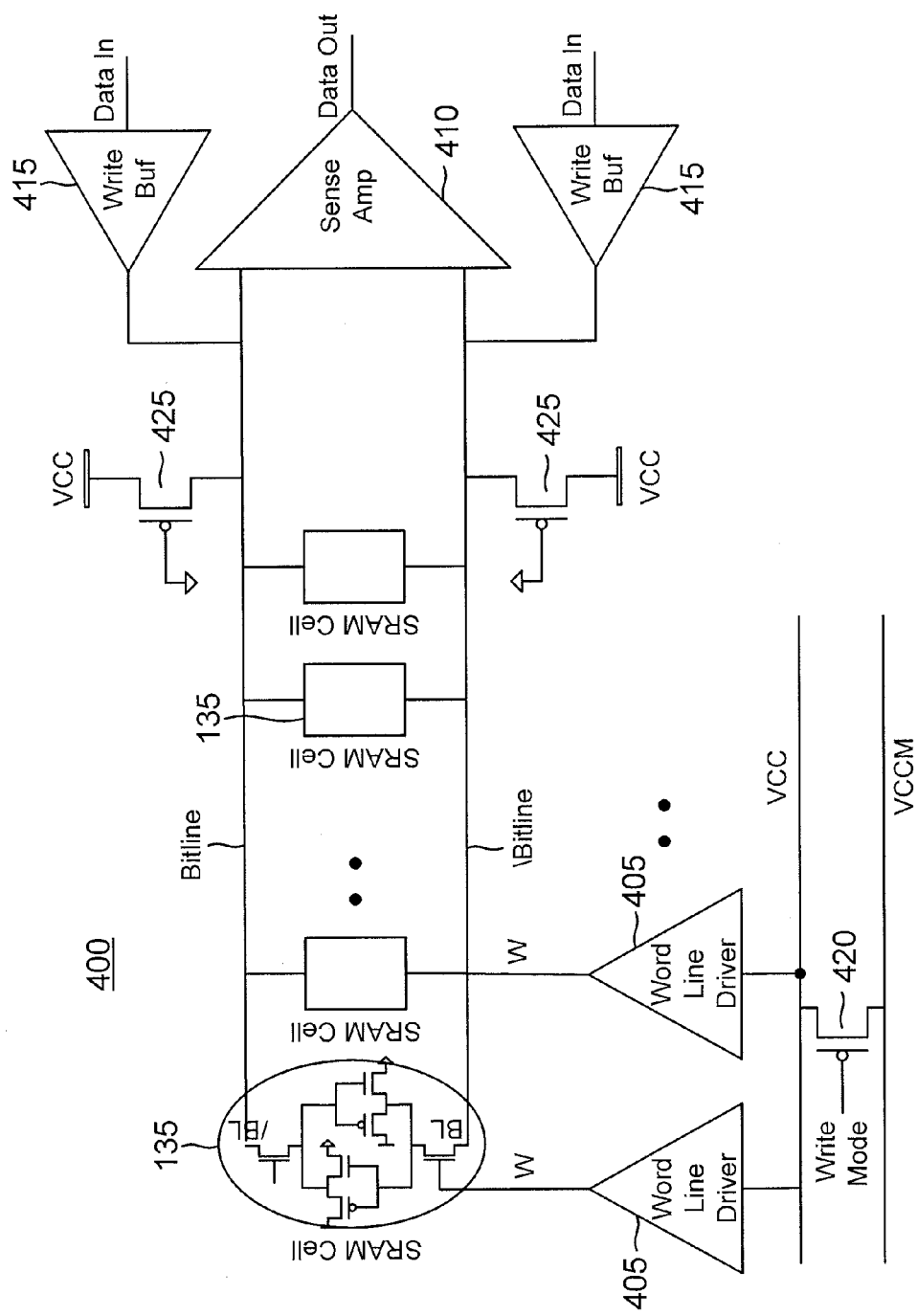
FIG. 4A illustrates an implementation of a column of SRAM cells in a programmable logic device and the corresponding word line drivers and sense amplifier.

A column of SRAM cells 135 is shown in FIG. 4A for a programmable logic device 400. The bit line and the complement (/) bit line couple to the Q and QB nodes (not explicitly shown in FIG. 4A) for the SRAM cells in the column. Each SRAM cell 135 corresponds to a particular row that intersects the column such that each SRAM cell 135 resides at a corresponding row and column intersection. A word line W corresponds to each row as driven by a corresponding word line driver 405. During configuration (write mode operation) of SRAM cells, write buffers 415 drive the bit line and the complement bit line to the desired complementary binary values (either VCC or ground). The word line W for the corresponding SRAM cell 135 is then asserted so that the desired logical value is stored in the corresponding SRAM cell 135. To fight leakage, the bit line and the complement bit line may be coupled to a VCC power node through a corresponding weak PMOS transistor 425 that has its gate grounded.

Each word line driver 405 is powered by a VCC voltage rail and will thus assert its word line to VCC during a read operation. But during a write operation, a write mode signal is asserted by being brought low to switch on a PMOS transistor 420 that couples between the VCC voltage rail and the VCCM voltage rail. The word lines can thus be asserted to the reduced level for the power supply voltage VCCM during the write operation.

Figure 4B:
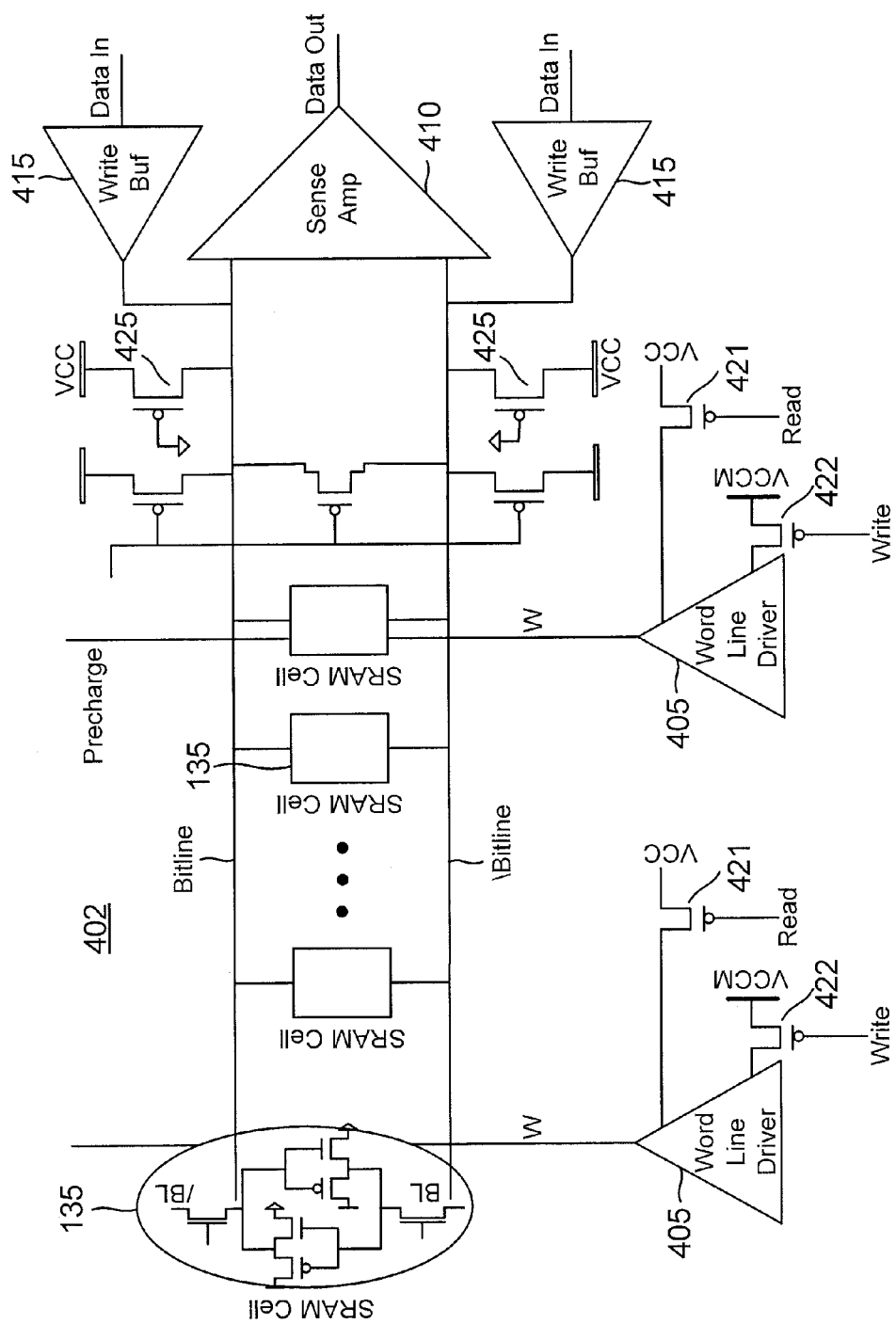
FIG. 4B illustrates another implementation of a column of SRAM cells in a programmable logic device and the corresponding word line drivers and sense amplifier.

FIG. 4B illustrates another implementation of a column of SRAM cells 135 for another programmable logic device 402. In FIG. 4B, different circuitry is associated with world line drivers 405. In this regard, each word line driver 405 is selectively powered by a VCC voltage rail through a PMOS transistor 421 during a read operation, or by a VCCM voltage rail through a PMOS transistor 422 during a write operation. In this embodiment, each word line driver 405 will thus assert its word line to VCC during a read operation, and to VCCM during a write operation, in response to the switching of transistors 421 and 422 (e.g., responsive to appropriate read and write signals).

Thus, in the embodiment illustrated in FIG. 4B, each word line driver 405 can be selectively coupled to different power supplies (e.g., VCC or VCCM). In some embodiments, read and write signals used in this and similar embodiments may be implemented as active high signals, such that they decouple associated PMOS transistors 421 and 422 when asserted high. In some embodiments, word line drivers 405 are operated in only two modes, namely read and write modes. For example, in such embodiments, word line drivers 405 may be always considered as being in read mode (e.g., normal operation) or write mode.

Figure 5:
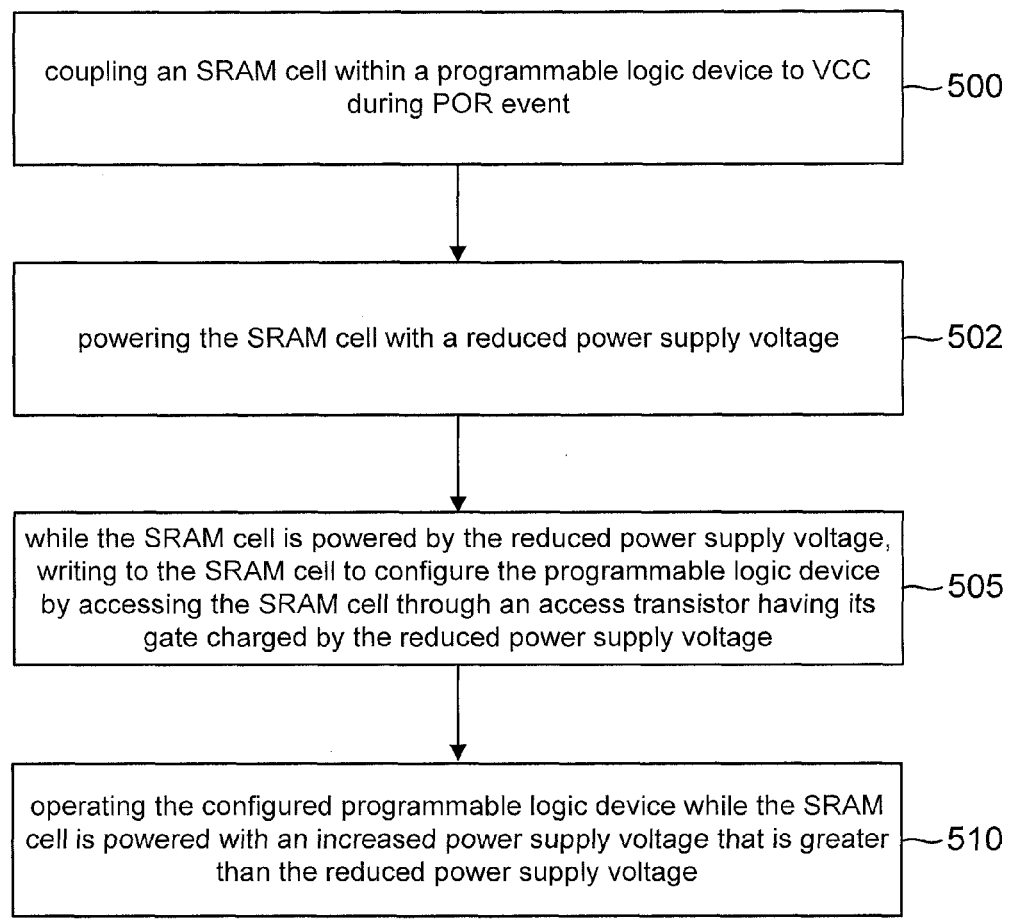
FIG. 5 is a flowchart for an example method of operation for a programmable logic device including a two-level voltage regulator.

An example method of operation for a programmable logic device including the two-level voltage regulation scheme disclosed herein will now be discussed. FIG. 5 is a flowchart for an example method of operation. The method starts with the act 500 of coupling the SRAM cells within a programmable logic device to (e.g., directly to) VCC during the POR event shown in FIG. 3. This is accomplished by activating transistor 130 of FIG. 1, while simultaneously disabling two-level power regulator 105. This allows the SRAM cells to be bulk erased and hold similar logic levels to the FPGA fabric that they control, thus avoiding excessive current surges in the device as it is powered up. Effectively, the VCCM node 160 of FIG. 1 is equivalent to VCC. The method then includes an act 502 of powering an SRAM cell (e.g., one or more of the SRAM cells within the programmable logic device) with a reduced power supply voltage. This is accomplished by deactivating transistor 130 of FIG. 1, and enabling two-level power regulator 105 of FIG. 1. In this case, the reduced power supply (e.g., VCCM node 160 of FIG. 1) is greater than the VCC level that was initially used to power the SRAM cells. An example of such an act is discussed above with regard to maintaining the power supply voltage VCCM at the reduced level so as to power SRAM cell 135 of FIGS. 1 and 2. The method also includes an act 505 that occurs while the SRAM cell is powered by the reduced power supply voltage and comprises writing to the SRAM cell to configure the programmable logic device by accessing the SRAM cell through an access transistor having its gate charged by the reduced power supply voltage. The discussion above with regard to charging the word line to the reduced level for the power supply voltage VCCM to access SRAM cell 135 is an example of act 505. Finally, the method includes an act 510 of operating the configured programmable logic device while the SRAM cell is powered with an increased power supply voltage (e.g., VCCM node 160 of FIG. 1) that is greater than the reduced power supply voltage. The boosting of VCCM to its elevated level as discussed with regard to the normal operating mode of FIG. 3 is an example of act 510.

It will be appreciated that the techniques and concepts discussed herein are not limited to the specific disclosed embodiments. The appended claims encompass all such changes and modifications as fall within the true spirit and scope of this invention.

I claim:

1. A programmable logic device, comprising:
a plurality of static random access memory (SRAM) cells arranged into a plurality of rows;
a plurality of word lines corresponding to the plurality of rows, wherein each SRAM cell comprises a pair of access transistors having their gates coupled to the SRAM cell's row's word line;
a plurality of word line drivers corresponding to the plurality of word lines, each word line driver being powered through a coupling to a second power supply node;
a switch coupled between the first power supply node and the second power supply node, wherein the control circuit is configured to close the switch during a write operation so that a selected one of the word lines is charged to the reduced voltage and to open the switch during a read operation;
a two-level voltage regulator configured to selectively charge a first power supply node to one of a reduced voltage and an enhanced voltage that is greater than the reduced voltage, wherein the SRAM cells are powered through a coupling to the first power supply node;
a power regulator configured to charge the second power supply node to an operating voltage that is lower than the reduced voltage during the read operation so that a selected one of the word lines is charged to the operating voltage during the read operation; and
a control circuit configured to control the two-level voltage regulator to charge the first power supply node to the reduced voltage during the write operation for the SRAM cells and to charge the first power supply node to the enhanced voltage during normal operation of the configured programmable logic device.

2. The programmable logic device of claim 1, wherein the control circuit is further configured to control the two-level voltage regulator to charge the first power supply voltage to the enhanced level during a read operation for the SRAM cells.

3. A programmable logic device, comprising:
a plurality of static random access memory (SRAM) cells configured to store a configuration for the programmable logic device;
a two-level voltage regulator configured to selectively charge a first power supply node to a reduced voltage and to an enhanced voltage that is greater than the reduced voltage, wherein the SRAM cells are powered through a coupling to the first power supply node; and
a control circuit configured to control the two-level voltage regulator to charge the first power supply node to the reduced voltage during a write operation for the SRAM cells and to charge the first power supply node to the enhanced voltage during normal operation of the configured programmable logic device
wherein the first power supply node comprises a voltage rail, and wherein the two-level voltage regulator comprises a differential amplifier configured to drive a gate of a transistor coupled between a second power supply node and the voltage rail responsive to a difference between a feedback voltage and a reference voltage.

4. The programmable logic device of claim 3, wherein the SRAM cells are arranged into a plurality of rows, the programmable logic device further comprising:
a plurality of word lines corresponding to the plurality of rows, wherein each SRAM cell comprises a pair of access transistors having their gates coupled to the SRAM cell's row's word line;
a first switch configured to be closed by the control circuit during a read operation and opened by the control circuit during a write operation;
a second switch configured to be opened by the control circuit during the read operation and closed by the control circuit during the write operation; and
a plurality of word line drivers corresponding to the plurality of word lines, each word line driver being selectively powered by the first power supply node through the first switch or by a second power supply node through the second switch.

5. The programmable logic device of claim 3, wherein the SRAM cells are arranged into a plurality of rows, the programmable logic device further comprising:
a plurality of word lines corresponding to the plurality of rows, wherein each SRAM cell comprises a pair of access transistors having their gates coupled to the SRAM cell's row's word line;
a plurality of word line drivers corresponding to the plurality of word lines, each word line driver being powered through a coupling to a second power supply node; and
a switch coupled between the first power supply node and the second power supply node, wherein the control circuit is configured to close the switch during the write operation so that a selected one of the word lines is charged to the reduced voltage and to open the switch during the read operation.

6. The programmable logic device of claim 5, further comprising a power regulator configured to charge the second power supply node to an operating voltage that is lower than the reduced voltage so that a selected one of the word lines is charged to the operating voltage during the read operation.

7. The programmable logic device of claim 3, further comprising a bandgap reference circuit configured to provide the reference voltage.

8. The programmable logic device of claim 3, further comprising;
a voltage divider coupled to the voltage rail, the voltage divider including a first node and a second node; and
a multiplexer configured to select between the first node and the second node to provide the feedback voltage to the differential amplifier.

9. The programmable logic device of claim 3, wherein the coupled transistor comprises a thick-gate-oxide transistor.

10. The programmable logic device of claim 9, wherein the thick-gate-oxide coupled transistor comprises a thick-gate-oxide NMOS transistor.

11. The programmable logic device of claim 7, further comprising a shunt transistor coupled between ground and the voltage rail.

12. A method, comprising:
powering an SRAM cell within a programmable logic device with a reduced power supply voltage;
while the SRAM cell is powered by the reduced power supply voltage, writing to the SRAM cell to configure the programmable logic device by accessing the SRAM cell through an access transistor having its gate charged by the reduced power supply voltage; and
operating the configured programmable logic device while the SRAM cell is powered with an increased power supply voltage that is greater than the reduced power supply voltage; and
reading a stored value in the SRAM cell while the SRAM cell is powered with the increased power supply voltage, wherein reading the stored value in the SRAM cell occurs through the access transistor by charging the gate of the access transistor to an operating voltage (VCC) that is lower than the reduced power supply voltage.

13. The method of claim 12, further comprising receiving a control signal, wherein the powering with a reduced power supply voltage is performed in response to an activation of the control signal, the method further comprising powering the SRAM cell with the increased power supply voltage in response to a deactivation of the control signal.

14. The method of claim 12, wherein the reduced power supply voltage is greater than a voltage of logic blocks coupled to the SRAM cells.

15. A method, comprising:
powering an SRAM cell within a programmable logic device with a reduced power supply voltage;
while the SRAM cell is powered by the reduced power supply voltage, writing to the SRAM cell to configure the programmable logic device by accessing the SRAM cell through an access transistor having its gate charged by the reduced power supply voltage; and
operating the configured programmable logic device while the SRAM cell is powered with an increased power supply voltage that is greater than the reduced power supply voltage wherein powering the SRAM cell with the reduced power supply voltage comprises driving a gate of a transistor coupled between a voltage rail carrying the reduced power supply voltage and a power supply node carrying a power supply voltage that is greater than the increased power supply voltage, wherein driving the gate of the transistor is responsive to a comparison of a feedback voltage to a reference voltage.

16. The method of claim 15, further comprising reading a stored value in the SRAM cell while the SRAM cell is powered with the increased power supply voltage, wherein reading the stored value in the SRAM cell occurs through the access transistor by charging the gate of the access transistor to an operating voltage (VCC) that is lower than the reduced power supply voltage.

17. The method of claim 15, further comprising receiving a control signal, wherein the powering with a reduced power supply voltage is performed in response to an activation of the control signal, the method further comprising powering the SRAM cell with the increased power supply voltage in response to a deactivation of the control signal.

18. The method of claim 15, wherein the reduced power supply voltage is greater than a voltage of logic blocks coupled to the SRAM cells.

* * * * *